United States Patent [19]

Takanashi et al.

[11] Patent Number: 5,367,359
[45] Date of Patent: Nov. 22, 1994

[54] PLATE-MAKING METHOD AND PLATE-MAKING APPARATUS FOR PRINTING

[75] Inventors: Itsuo Takanashi, Kamakura; Shintaro Nakagaki, Miura; Tsutou Asakura; Masato Furuya, both of Yokohama; Yoshihisa Koyama, Yokosuka; Yuji Uchiyama, Chigasaki, all of Japan

[73] Assignee: Victor Company of Japan, Ltd., Yokohama, Japan

[21] Appl. No.: 47,337

[22] Filed: Apr. 19, 1993

Related U.S. Application Data

[63] Continuation of Ser. No. 696,411, May 6, 1991, abandoned.

[30] Foreign Application Priority Data

May 17, 1990 [JP] Japan .................. 2-127766

[51] Int. Cl.⁵ .......................... G03G 16/00
[52] U.S. Cl. ........................ 355/71; 359/41; 359/72; 101/456 X
[58] Field of Search ............ 355/202, 35, 71; 101/456, 463.1, 471; 359/40, 41, 72, 71

[56] References Cited

U.S. PATENT DOCUMENTS

| | | | |
|---|---|---|---|
| 3,762,325 | 10/1973 | Hallman et al. | 101/456 X |
| 3,772,016 | 11/1973 | Anderson, Jr. et al. | 101/456 X |
| 3,890,041 | 6/1975 | Henkler | 355/71 X |
| 3,948,655 | 4/1976 | Wells | 101/401.1 X |
| 4,002,829 | 1/1977 | Hutchison | 358/481 |
| 4,150,396 | 4/1979 | Hareng et al. | 359/41 X |
| 4,672,014 | 6/1987 | Joiner et al. | 359/40 X |

FOREIGN PATENT DOCUMENTS

63-168618 7/1988 Japan.

OTHER PUBLICATIONS

Grinberg et al., "A New Real-Time Non-Coherent to Coherent Light Image Converter . . . ", Optical Engineering vol. 14 No. 3, May-Jun. 1975, pp. 217–224.
Haas et al., "Ultralow-voltage Image Intensifiers", Applied Physics Letters vol. 29 No. 10, Nov. 15, 1976, pp. 631–632.

Primary Examiner—Benjamin R. Fuller
Assistant Examiner—John E. Barlow, Jr.
Attorney, Agent, or Firm—Lowe, Price, LeBlanc & Becker

[57] ABSTRACT

A plate-making apparatus equipped with an optical system and a light-light transforming device comprising a photoconductive layer and a light-modulation layer which are in confronting relation to each other and which are interposed between a pair of electrodes. The optical system supplies optical information to the photoconductive layer, and the pair of electrodes are for generating an electric field therebetween to be applied to the photosensitive layer and the light-modulation layer. Also included in the apparatus for emitting light having a predetermined wavelength, the light being led to the light-modulation layer to generate reflection light therefrom which is modulated in correspondance with the optical information supplied from the optical system to the photoconductive layer. The reflection light is arranged so as to illuminate a photosensitive resin layer, which is in turn denatured or hardened in response to the illumination so as to produce a print plate.

1 Claim, 4 Drawing Sheets

PLATE-MAKING METHOD AND PLATE-MAKING APPARATUS FOR PRINTING

This application is a continuation application of application Ser. No. 07/696,411, filed May 6, 1991, now abandoned.

BACKGROUND OF THE INVENTION

The present invention relates generally to plate-making method and plate-making apparatus for the printing original plate, and more particularly to a plate-making method and plate-making apparatus arranged to use a photosensitive resin denatured or hardened in response to ultraviolet light.

Generally, for relief printing technique is known a technique in which, with a negative or positive film being used as a mask, an etching-proof thin-film is formed by light illumination using a photo-resist to effect a partial etching of a metal (for example) or a relief is produced using a photosensitive resin of the type that is undissolved by light illumination. There are problems which arise with such a plate-making technique, however, in that it is required to produce a transmission-type film to be used as a mask and further to produce three kinds of plates, i.e., Y (yellow), M (magenta) and C (cyan), for the color original printing. In addition, ultraviolet light required for exposing the photosensitive resin and hence difficulty is encountered to produce the three kinds plates color-distributed from the color original.

SUMMARY OF THE INVENTION

It is therefore an object of the present invention to eliminate the above-described conventional problems and to provide a plate-making method and plate-making apparatus which are capable of easily producing the printing original plates concurrently with allowing high-resolution printing.

According to a feature of this invention, a plate-making apparatus is equipped with light-light transforming means comprising a photoconductive layer and a light-modulation layer which are in confronting relation to each other and which are interposed between a pair of electrodes. Information supplying means supplies electromagnetic wave information to the photoconductive layer of the light-light transforming means, and power source means applies a voltage to the pair of electrodes so that an electric field is generated between the pair of electrodes. Also included are light source means for emitting light having a predetermined wavelength and illumination means for illuminating the light from the light source means to the light-modulation layer to generate reflection light or transmission light modulated in correspondance with the electromagnetic wave information supplied from the information supplying means to the photoconductive layer. The illumination means is further arranged so as to illuminate a photosensitive means with the reflection light or the transmission light whereby the photosensitive means is denatured or hardened in response to the illumination.

The information supplying means can be composed of an optical system to supply light including information as the electromagnetic wave information to the photoconductive layer. The photoconductive layer has a characteristic whereby its electric resistance varies in accordance with the intensity of the information light from the information supplying means, and the light-modulation layer has a characteristic whereby its internal state varies accordance with the electric resistance variation of the photoconductive layer so that the reflection light or the transmission light generated due to the light-modulation layer is optically modulated in accordance with the information light from the information supplying means.

In accordance with the present invention, there is further provided a method of making a print plate by using light-light transforming means comprising a photoconductive layer and a light-modulation means which are arranged to be in confronting relation to each other and which are interposed between a pair of electrodes, the method comprising the steps of: supplying electromagnetic wave information to the photoconductive layer which has a characteristic whereby its internal state varies in accordance with the electromagnetic wave information; applying a voltage between the pair of electrodes so as generate an electric field therebetween which varies in accordance with the internal state variation of the photoconductive layer, the electric field being applied to said light-modulation layer having a characteristic whereby its internal state varies in accordance with the variation of the electric field; and illuminating the light-modulation layer with light having a predetermined wavelength to generate reflection light or transmission light and leading the reflection light or the transmission light to a photosensitive resin layer which is denatured or hardened in response to the reflection light or the transmission light.

BRIEF DESCRIPTION OF THE DRAWINGS

The object and features of the present invention will become more readily apparent from the following detailed description of the preferred embodiments taken in conjunction with the accompanying drawings in which.

DETAILED DESCRIPTION OF THE INVENTION

Figure 1:
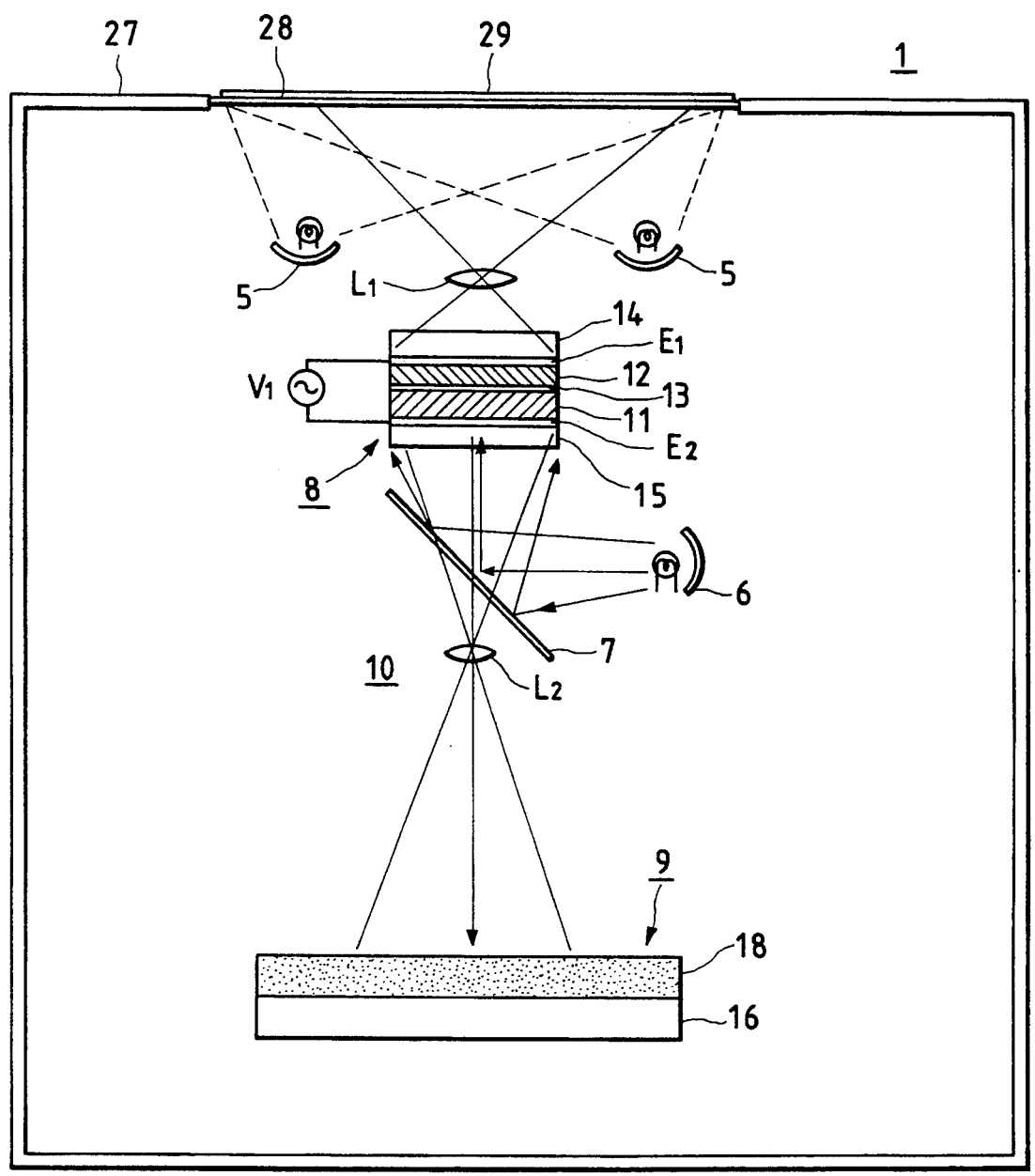
FIG. 1 is an illustration for describing a plate-making method and plate-making apparatus according to a first embodiment of the present invention.

Referring now to FIG. 1, there is schematically illustrated a plate-making apparatus according to a first embodiment of the present invention. In FIG. 1,. the plate-making apparatus, illustrated at numeral 1, is equipped with an optical system including a light source 5, lenses L1, L2, a semitransparentmirror 7 and an ultraviolet light source 6. Illustrated at numeral 8 is an information recording section and illustrated at numeral 9 is a print original plate. The information recording section 8 is composed of a light-modulation layer 11 made of a polymer dispersed liquid crystal film (for example), a photoconductive layer 12, a dielectric mirror 13, transparent electrodes E1, E2, transparent supporting members 14, 15, and a power source V1 for applying a voltage to the transparent electrodes E1, E2. The photoconductive layer 12 and the light-modulation layer 11 are arranged to be in confronting relation-to each other with the dielectric mirror 13 being interposed therebetween, the transparent electrodes E1 and E2 are respectively disposed on the outer surfaces of the light-modulation layer 11 and the photoconductive layer 12 with respect to the dielectric mirror 13, and further the transparent supporting members 14 and 15 are respectively disposed on the outer surfaces of the transparent electrodes E1 and E2 with respect thereto. The print original plate 9 is composed of a supporting member 16 and a photosensitive resin 18 attached onto one surface of the supporting member 16. The aforementioned parts are encased and arranged in a housing 27 of the plate-making apparatus 1, and the housing 27 is provided with a window glass 28 formed in the upper surface thereof. On the window glass 28 there is placed an original 29 such as a picture.

Secondly, operation of the above-described plate-making apparatus thus arranged will be described hereinbelow. The light source 5 emits light so as to illuminate the original 29 as shown in FIG. 1. The reflection light from the original 29 reaches the lens L1 so as to be condensed and then directed to the information recording section 8. The reflection light therefrom passes through the supporting member 14 and the electrode E1 to reach the photoconductive layer 12. In response to the reflection light including the optical information corresponding to the original 29, the electric resistances of the respective portions of the photoconductive layer 12 vary in accordance with the intensities (bright and dark) of the reflection light. With this resistance variation, the intensity distribution of the electric field in the light-modulation layer 11 generated by means of the electrodes E1 and E2 substantially varies in inversely proportion to the resistance variation. Consequently, the state such as orientation of the light-modulation layer 11 varies in accordance with the electric field intensity distribution. The light-modulation layer 11 whose state varies is illuminated with ultraviolet light to be emitted from the ultraviolet light source 6. That is, the ultraviolet light emitted from the ultraviolet light source 6 is reflected by the semitransparent mirror 7 so as to reach the light-modulation layer 11 after passing through the supporting member 15 and the electrode E2. After passing through the light-modulation layer 11, the ultraviolet light is reflected on the dielectric mirror 13 and then directed through the light-modulation layer 11, the semitransparent mirror 7 and the lens L2 to the photosensitive resin 18 of the print original plate 9 to illuminate it. Here, in passing through the light-modulation layer 11, the illumination light is modulated in accordance with the state variation, whereby the photosensitive resin 18 is illuminated with an optical image corresponding to the optical information of the original 29.

The material of the light-modulation layer 11 is not limited to the above-mentioned polymer dispersed liquid crystal film but a PLZT (compound of Pb, La, Zr, Ti) can be used therefor or a light-modulation material such as a nematic liquid crystal using the birefringent effect can also be used therefor. Here, in the case of using the birefringent effect, a polarization beam-splitter may be used in place of the semitransparent mirror 7. According to an apparatus using the birefringent effect of the nematic liquid crystal or the like, it is possible to obtain a negative image of the original by adequately selecting the optical system or the drive condition and hence it is effective in the case of performing the exposure of the photosensitive resin 18 with the negative image.

The following are the examples of the print original plate comprising the photosensitive resin:
1) metallic plate with a photo resist (negative, positive exposure);
2) photosensitive resin relief (negative exposure);
3) photosensitive flexible plate (negative exposure);
4) screen plate (negative, positive exposure); and
5) flat plate, PS (Presensitized plate) plate.

Further, a description will be made hereinbelow with reference to FIG. 2 in terms of a plate-making method and plate-making apparatus according to a second embodiment of this invention. Here, parts corresponding to those in the above-described first embodiment are marked with the same reference numerals and the detailed description thereof will be omitted for brevity, and the illustration of the housing 27 is omitted in FIG. 2.

Figure 2:
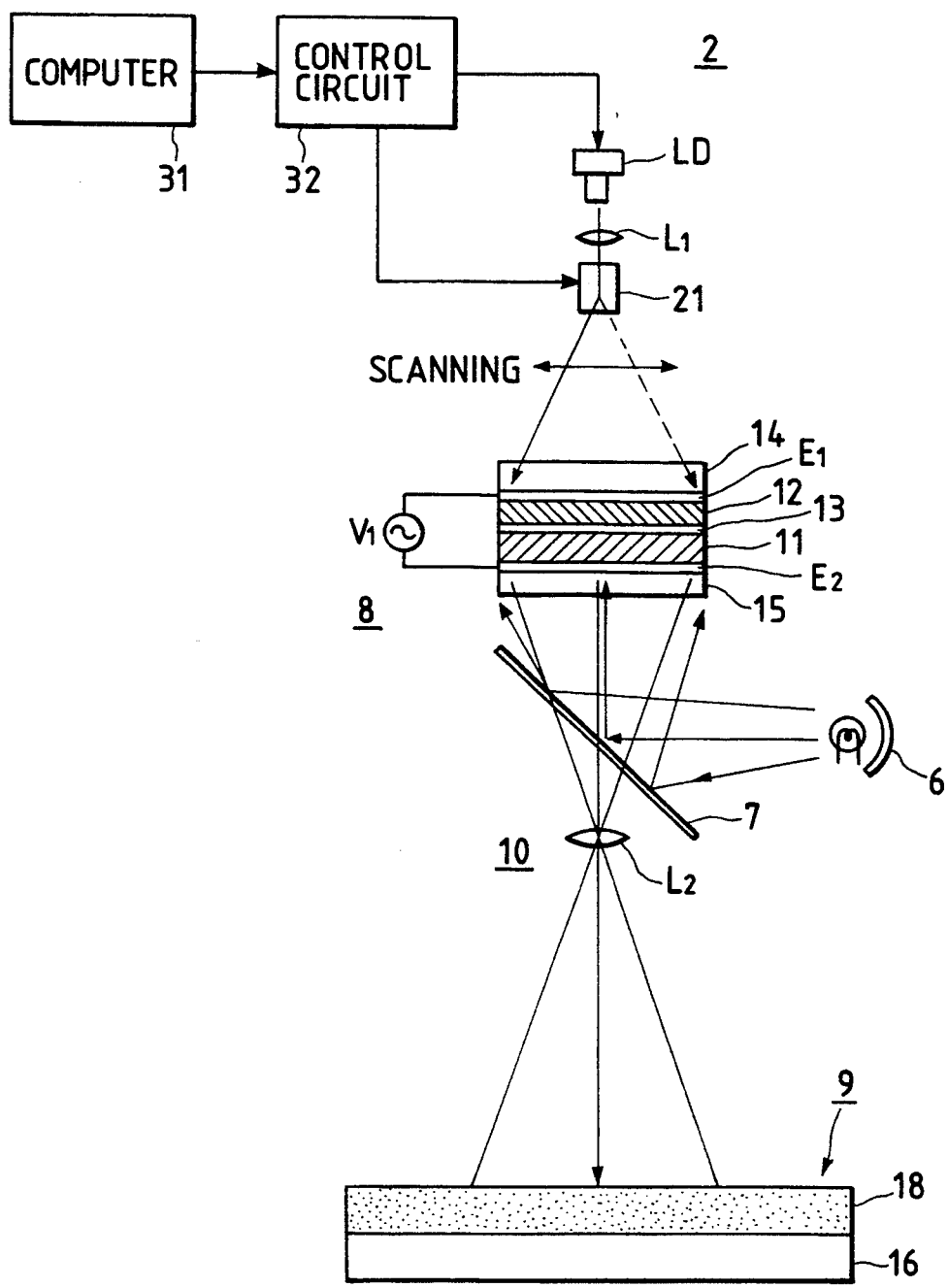
FIG. 2 is an illustration for describing a plate-making method and plate-making apparatus according to a second embodiment of the present invention.

As obvious from FIG. 2, the plate-making apparatus of the second embodiment is arranged to perform the printing (hard-copy) in accordance with an image signal from a computer 31 in place of the original 29. That is, the plate-making apparatus is equipped with a control circuit 32 and a writing system comprising a laser diode LD, a deflection device (laser beam scanning device) 21 and others. The information made due to the edit and image process through the computer 31 can directly be used for producing the print original plate without displaying on a CRT or the like.

Figure 3:
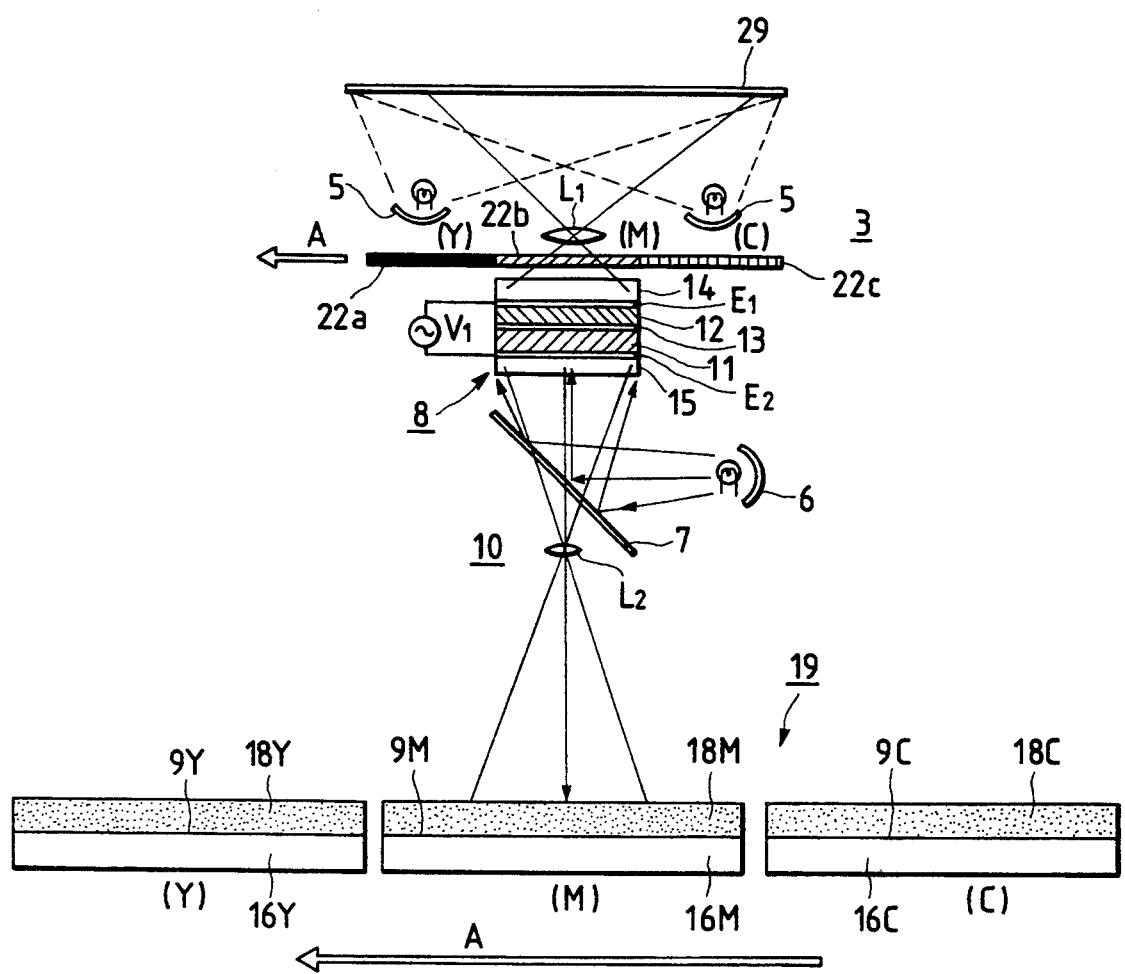
FIG. 3 is an illustration for describing a plate-making method and plate-making apparatus according to a third embodiment of this invention.

Still further, a description will be made hereinbelow with reference to FIG. 3 in terms of a third embodiment of this invention, where parts corresponding to those in FIG. 1 or 2 are marked with the same reference numerals and the description thereof will be omitted for brevity. A plate-making apparatus of this third embodiment is for the case that the original 29 is a color original. That is, the apparatus is additionally equipped with three kinds of color filters 22a, 22b and 22c disposed between the lens L1 and the information recording section 8, and further provided with a print original plate section 19 comprising three color original plates, i.e., a yellow original plate 9Y, a magenta original plate 9M and a cyan original plate 9C, in place of the print original plate 9 in FIG. 1.

The original 29 is illuminated with light emitted from a white light source 5 and the reflection light passes through the color filters 22a to 22c and directs through the supporting member 14 and the electrode E1 to the photosensitive layer 12 to perform the photoelectric conversion. In this case, the color filters 22a to 22c are adequately set and moved in the direction indicated by an arrow A. At the same time, the print original plate section 19 is also moved in the same direction A, thereby manufacturing three-color (yellow, magenta and cyan) print original plates which allow complete color reproducibility.

Figure 4:
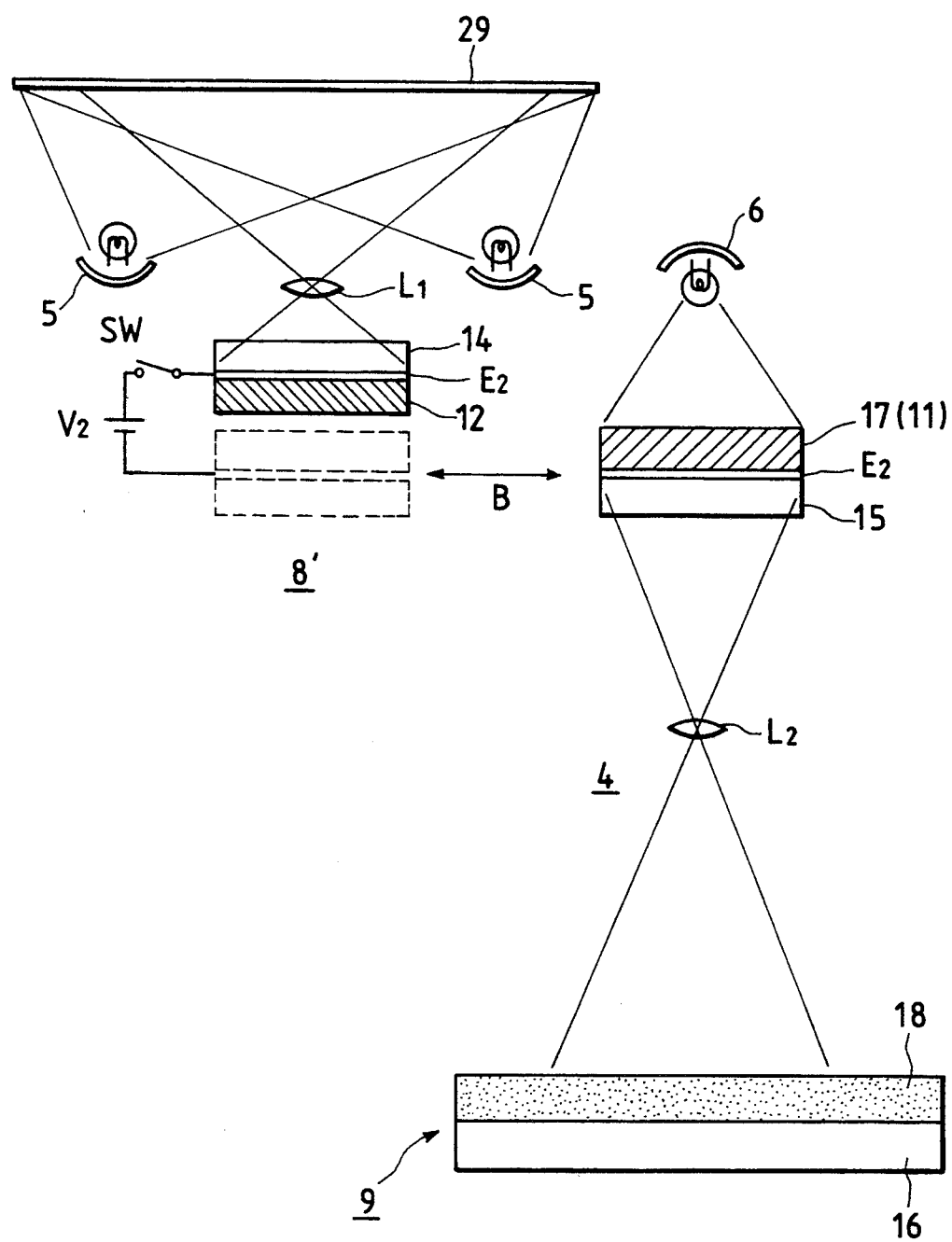
FIG. 4 is an illustration for describing a plate-making method and plate-making apparatus according to a fourth embodiment of this invention.

In addition, a fourth embodiment of this invention will be described hereinbelow with reference to FIG. 4. In FIG. 4, an apparatus is in place of the light-modulation layer 11, equipped with a memory device 17 such as a polymer dispersed liquid crystal memory film and a PLZT ceramics which has a memory function. After recording the optical information corresponding to the original 29 in the memory device 17 in accordance with a similar manner, the memory device 17, together with the electrode E2 and the supporting member 15, is moved to be separated from the information recording section 8' along the direction indicated by an arrow B. After moved by an adequate distance, the memory device 17 is illuminated with ultraviolet light emitted from the ultraviolet light source 6. The transmission light directs to the lens L2 before reaching the photosensitive resin 18. This arrangement allows preventing the light quantity from being reduced.

It should be understood that the foregoing relates to only preferred embodiments of the present invention, and that it is intended to cover all changes and modifications of the embodiments of the invention herein used for the purposes of the disclosure, which do not constitute departures from the spirit and scope of the invention. For example, the light source 6 is not limited to the ultraviolet light source but any light source can be employed which has a wavelength range whereby the photosensitive resin is responsive. Furthermore, this invention can be applied to different apparatus such as an electronic device and a semiconductor etching device.

What is claimed is:

1. An apparatus for making a print plate, comprising:

light-light transforming means including a photoconductive layer and a light-modulation layer which are in confronting relation to each other and which are interposed between a pair of electrodes, said photoconductive layer and said light-modulation layer are arranged to be separable from each other;

information supplying means for supplying electromagnetic wave information to said photoconductive layer of said light-light transforming means;

power source means for applying a voltage to said pair of electrodes so that an electric field is generated between said pair of electrodes;

photosensitive means having a characteristic to be denatured or hardened in response to light having a predetermined wavelength;

light source means for emitting the light having said predetermined wavelength to denature or harden said photosensitive means; and illumination means for illuminating the light from said light source means to said light-modulation layer to generate reflection light or transmission light modulated in correspondence with the electromagnetic wave information supplied from said information supplying means to said photoconductive layer, said illumination means being arranged so as to illuminate said photosensitive means with the reflection light or the transmission light.

\* \* \* \* \*